United States Patent [19]

Misencik

[11] Patent Number: 4,739,450

[45] Date of Patent: Apr. 19, 1988

[54] GROUND FAULT RECEPTACLE WITH COMPACT COMPONENT ARRANGEMENT

[75] Inventor: John J. Misencik, Shelton, Conn.

[73] Assignee: Westinghouse Electric Corp., Pittsburgh, Pa.

[21] Appl. No.: 22,618

[22] Filed: Mar. 4, 1987

Related U.S. Application Data

[63] Continuation of Ser. No. 751,656, Jul. 3, 1985, abandoned.

[51] Int. Cl.$^4$ .................... H05K 5/00

[52] U.S. Cl. .................... 361/394; 335/18; 336/198; 336/208; 361/42; 361/395

[58] Field of Search .................... 174/53; 335/18; 339/147 R; 336/174, 175, 198, 208; 361/42, 45, 46, 54, 380, 392, 394, 395, 399

[56] References Cited

U.S. PATENT DOCUMENTS 3,355,687 11/1967 Adams .................... 336/208
3,428,929 2/1969 Brown et al. .................... 336/198
3,601,735 8/1971 Bercovici .................... 336/208
4,001,647 1/1977 Klein et al. .................... 317/18 D
4,013,929 3/1977 Dietz et al. .................... 361/357
4,034,266 7/1977 Virani et al. .................... 361/42
4,363,014 12/1982 Leach et al. .................... 336/208
4,442,470 4/1984 Misencik .................... 361/46
4,503,413 3/1985 Stalzer .................... 336/208
4,567,544 1/1986 Ronemus et al. .................... 361/394

*Primary Examiner*—A. D. Pellinen
*Assistant Examiner*—Gregory D. Thompson
*Attorney, Agent, or Firm*—G. H. Telfer

[57] ABSTRACT

A receptacle with a ground fault circuit interrupter has a load contact and housing configuration in which a varistor for electronics protection is disposed with pressure contact to adjacent spring fingers of the load contacts. Also, a pre-assembly of molded plastic carrier elements supporting a sensing transformer, grounded neutral transformer, trip solenoid, and hybrid electronic circuit as a unit is disposed within the housing.

9 Claims, 10 Drawing Sheets

GROUND FAULT RECEPTACLE WITH COMPACT COMPONENT ARRANGEMENT

This application is a continuation of application Ser. No. 751,656 filed July 3, 1985 now abandoned.

BACKGROUND AND SUMMARY OF THE INVENTION

This invention relates to electrical receptacles, such as for use in wall outlet boxes, with ground fault protection.

For background and general description, reference is made to Virani et al. U.S. Pat. No. 4,010,431, Mar. 1, 1977 which describes a ground fault receptacle on which the present invention improves and which is hereby incorporated by reference.

The general purposes of this invention are to achieve greater package density in a ground fault receptacle and to do so by a manner and means that reduces assembly time and cost. More dense packaging is sought so a fully assembled unit can be installed more easily and quickly in an ordinary outlet box but at the same time the cost needs to be minimized and the reliability maximized.

Among the improvements of this invention are to provide an arrangement including load terminals, of one piece construction for each polarity of lines that have a protruding spring finger so that a varistor for protection of the electronics can be inserted easily between the load terminal fingers and pressure contact made therewith. The housing base and front cover cooperate to maintain the varistor in position. In this manner the need for soldering the varistor into the circuit of the receptacle, as has been required heretofore, is avoided.

In another aspect of the invention, a carrier is provided that permits a sensing transformer, grounded neutral transformer, a hybrid electronic circuit, and a trip solenoid to be preassembled as a unit and simply inserted into the receptacle housing with minimal additional electrical connections. The carrier, which may be of molded plastic material, has a sensor carrier element and a solenoid carrier element that snap together and are interlocked in such a way as to present aligned ports for the leads of the hybrid circuit without requiring bending, cutting or other modification of their configuration. This achieves a unitary electronic sensing and operating pre-assembly with high density and economy.

These and other aspects of the invention will be better understood in conjunction with the following description and accompanying drawing.

DESCRIPTION OF THE PREFERRED EMBODIMENTS

Figure 1:
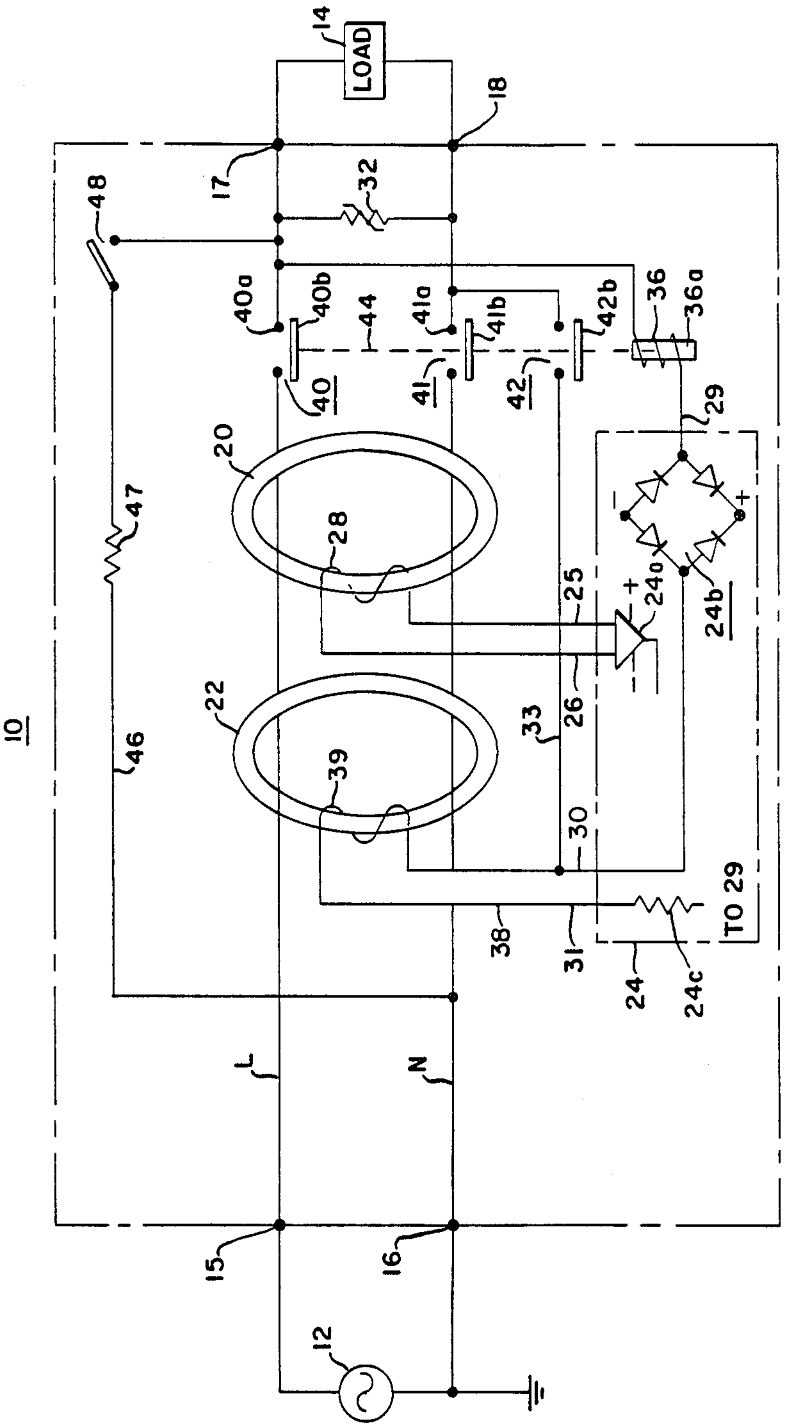
FIG. 1 is an electrical circuit schematic of a ground fault receptacle in accordance with the present invention.

Referring to FIG. 1, a ground fault circuit interrupter 10 in accordance with the present invention is schematically illustrated connected between an ac supply 12 and a load 14. The system depicted is a single phase, two-wire, system in which the distribution conductors are identified as a hot line conductor L and a neutral conductor N, the latter being connected to the ground side of the supply 12. Conductors L and N extend to the load 14 through the interrupter unit 10 by connections at input terminals 15 and 16 and output or load terminals 17 and 18. For use in a ground fault receptacle, the unit 10 is associated with the load 14 through a male plug and female socket connection in the normal manner at the output terminals 17 and 18.

The unit 10 has a sensor transformer 20 through which conductors L and N extend as primary windings. Conductors L and N also extend as primary windings through an additional grounded neutral transformer 22 which may, for example, be arranged substantially in accordance with Colely et al. U.S. Pat. No. 3,959,693, May 25, 1976.

The unit 10 further includes an electronic circuit 24 that may sometimes be referred to herein simply as the hybrid circuit as the usual manner of its construction is by hybrid circuit techniques in which components are mounted and interconnected on a substrate, such as for a ceramic material, and enclosed or potted in a resinous insulation material except for terminal leads extending therefrom. Suitable circuitry for the electronic circuit 24 is generally known. As one example, an amplifier and trip subcircuit **24*a* (not fully shown) in accordance with Engel et al. U.S. Pat. No. 3,852,642, Dec. 3, 1974 may be used in the electronic circuit 24, in addition to other components to be described hereinafter. The subcircuit 24*a* has inputs 25 and 26 from a sensing winding 28 of the sensing transformer 20**.

The circuit 24 also includes a full wave rectifier bridge **24*b* connected at two additional terminals 29 and 30 for developing operating power for circuit 24. A trip signal to solenoid coil 36 is derived from terminal 29. A further terminal 31 of the circuit 24 is connected to join a grounded neutral resistor 24*c* within circuit 24 to branch 38 that is connected to one side of winding 39 on grounded neutral transformer 22. The circuit 24** is therefore, in this example, a hybrid circuit with five leads.

Each of the conductors L and N has switches 40 and 41 connected respectively in series with them which respectively comprise stationary contacts 40*a* and 41*a* and movable contacts 40*b* and 41*b*. Circuit branch 33 connects to conductor N through a third switch 42 having a movable contact 42*b* operated by the plunger 36*a* of the solenoid associated with the coil 36 to close in contact with conductor N. Dashed line 44 schematically represents a mechanical linkage (normally of a plurality of elements including at least one solenoid plunger 36*a*) to the movable contacts 40*b*, 41*b* and 42*b*. It is also the case that the movable contact 42*b* of the third switch 42 is a latch member that latches in the closed position the switches 40 and 41 of the L and N conductors as well as the third switch 42. The physical arrangement and manner of operation of the switches 40, 41 and 42 may be in accordance with the above-mentioned Virani et al. patent as improved by Misencik U.S. Pat. No. 4,442,470, Apr. 10, 1984, which is herein incorporated by reference.

A test circuit branch 46 is connected from a point on the load side of conductor L to a point on the supply side of conductor N. Branch 46 includes a resistor 47 and a test switch 48. Manual operation of switch 48 produces a current imbalance in conductors L and N that causes a trip indicating the operability of the unit 10.

A varistor 32 for protection of the unit 10 against damage due to overvoltages, such as transient surges, is connected as shown between the load terminals 17 and 18. One aspect of the present invention is an improvement in the manner in which varistor 32 is arranged and connected in the unit 10. By this invention, as illustrated in the specific embodiment, such as FIG. 5B, varistor 32 is conductively engaged merely by pressure to spring elements 60C and 61C of load contact elements 60 and 61 that correspond to the load terminals 17 and 18 of FIG. 1.

A ground fault receptacle 10 as shown in FIG. 1 is desirably made in as compact and inexpensive a manner as possible. Compactness is sought to minimize the bulk that has to be fit into a wall outlet box. Economy in the choice of components is important but an overriding consideration is to have a unit that permits the numerous elements to be assembled quickly and simply so it can be made reliably in large numbers at a high rate with a relatively low degree of assembly skill. The present invention addresses these interests and provides a unit designed for both quality and economy.

Figure 2:
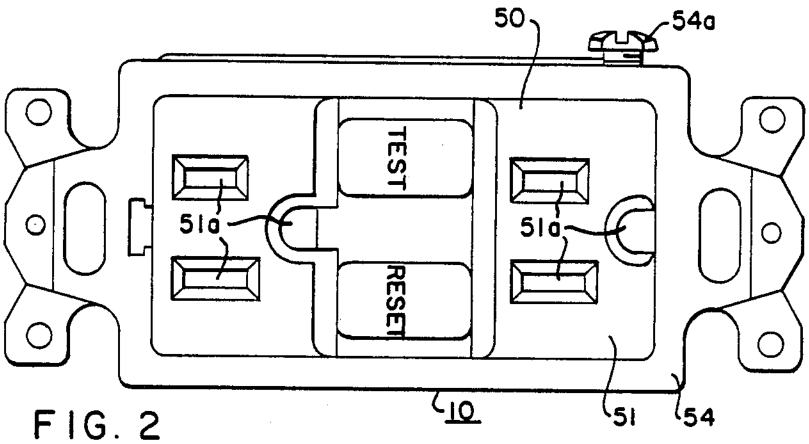
FIG. 2 is a front view of a ground fault receptacle in accordance with an embodiment of the present invention.

FIG. 2 shows an assembled front view which is substantially similar to prior ground fault receptacles. This is a duplex receptacle having within an insulating housing 50 all the components of unit 10 of FIG. 1 for interrelation with each of two plugs to be inserted through apertures 51*a* in front cover 51 of the housing. Housing 50 includes a front or top cover 51, a back or bottom cover 52 (FIG. 7), and a base 53 (e.g. FIGS. 3 and 4), each of molded insulating material. The housing 50 is disposed in association with a metal mounting yoke 54 that in this version is a substantially planar element of which part is disposed between the base 53 of the housing and its front cover 51 in a conventional manner. Grounding terminals extend inwardly from the yoke 54 into the base 53 and are accessed through the arcuate shaped ones of the openings 51*a*, as has been done previously. A grounding terminal screw 54*a* is associated with a side extension of the yoke 54 for connection of an external grounding wire in the usual manner. Centrally located in the front cover 51 are test and reset buttons (labeled) as is the practice in ground fault receptacles.

Figure 7:
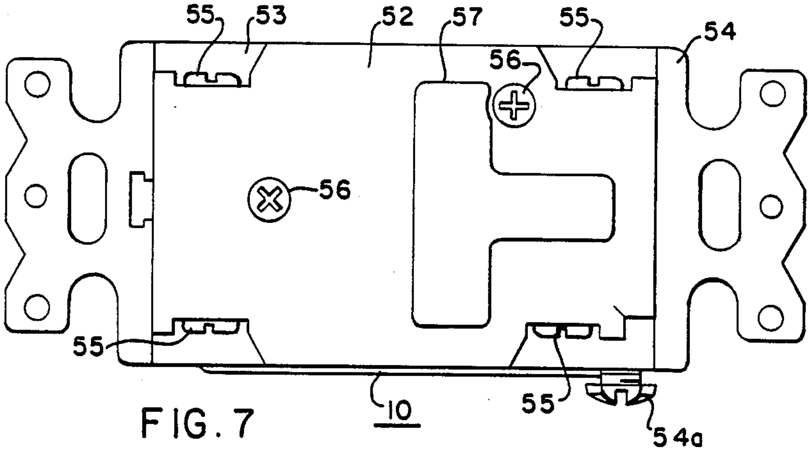
FIG. 7 is a rear view of a fully assembled unit.

In the bottom view of FIG. 7 is seen the bottom cover 52 of the housing 50. The housing base 53 and its bottom cover 52 have side recesses at which terminal screws 55 are located for connecting wires to internal contacts of the unit. The bottom cover 52 has recessed fasteners 56 for securing the unit together. A T-shaped area 57 is a minor enlargement of the recess in the back cover for the accommodation of internal components. In the specific embodiment described, the area 57 is one that extends from the main portion of the back cover 52 by only about 0.040 in. It shows an example of how the box-like unit of base 53 and covers 50 and 52 can have minor nonuniformities for convenience in holding the contained elements.

Figure 3:
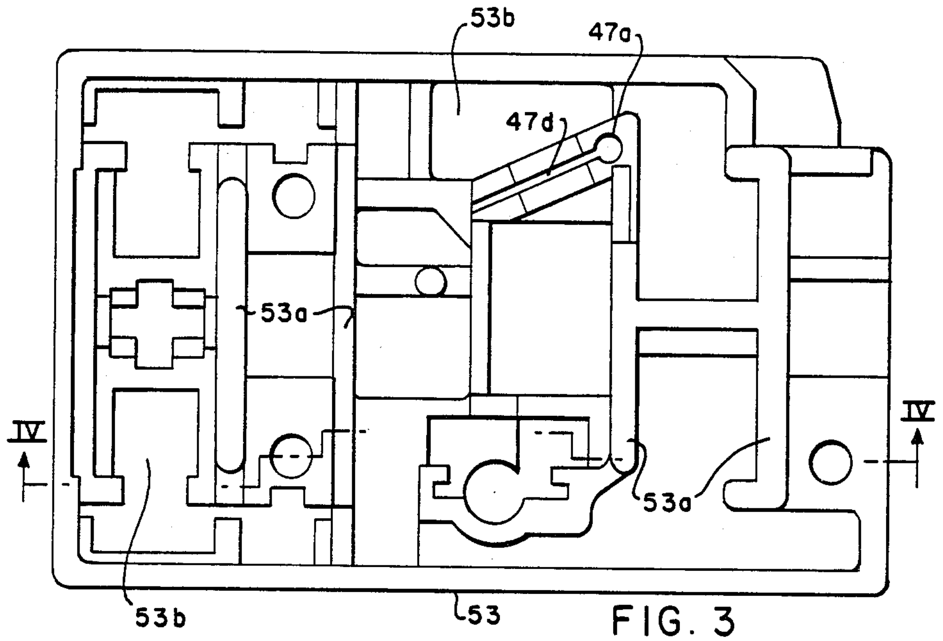
FIG. 3 is a front view of a housing base for the unit of FIG. 2.
Figure 4:
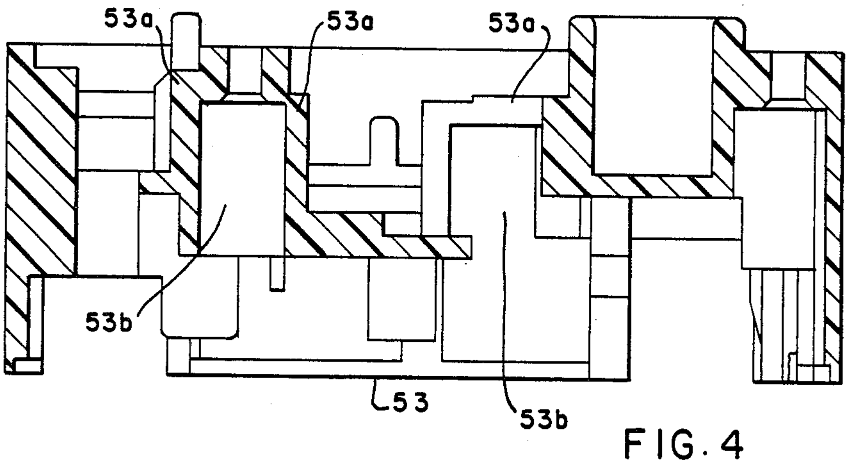
FIG. 4 is a sectional view taken along the line IV—IV of FIG. 3.
Figure 8:
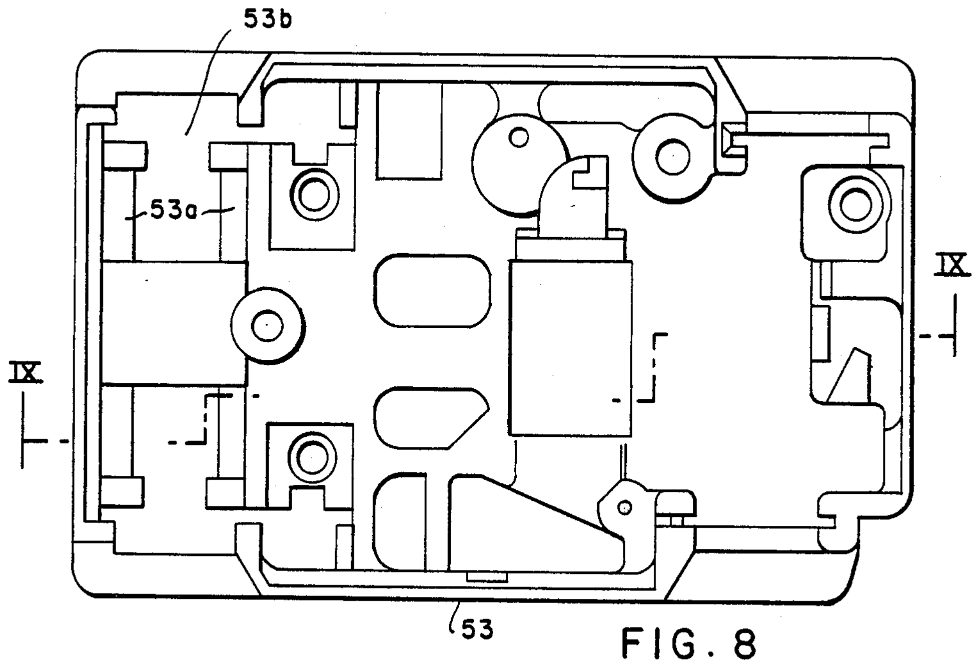
FIG. 8 is a rear view of a housing base for the unit.
Figure 9:
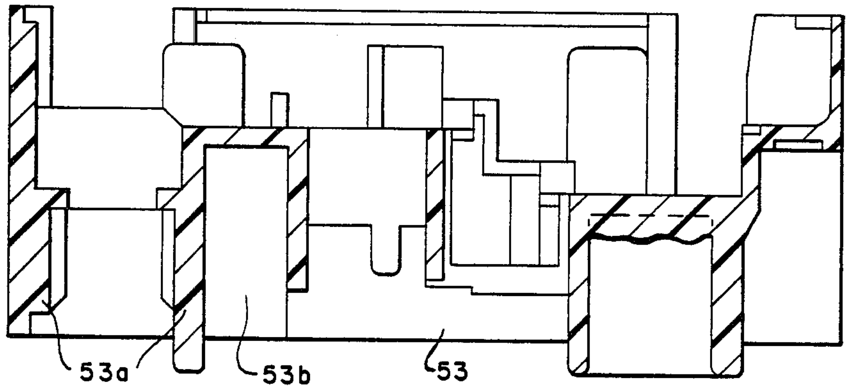
FIG. 9 is a sectional view taken along the line IX—IX of FIG. 8.

FIGS. 3 and 4 show the base 53 of the unit, unassembled, respectively from the top and in section. FIG. 8 shows a view of the base 53, unassembled, from the bottom with FIG. 9 being a section of FIG. 8. What is generally illustrated is that the base 53 is a molded plastic element that is compartmentalized by numerous partitions or walls separating recesses or openings, of which partitions 53*a* and openings 53*b*, are examples, to accommodate internal components of the unit.

Figure 6:
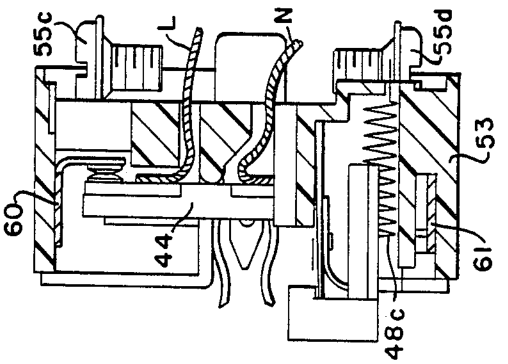
FIG. 6 is a sectional view taken along the line VI—VI of FIG. 5.
Figure 5:
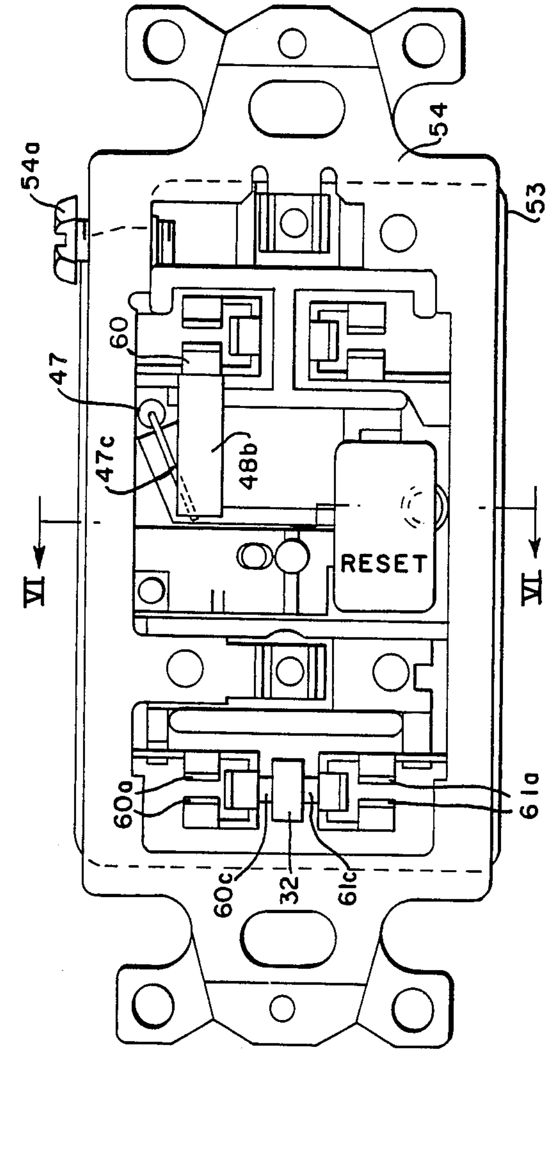
FIG. 5 is a front view of the assembled ground fault receptacle but without its front cover.
Figure 11:
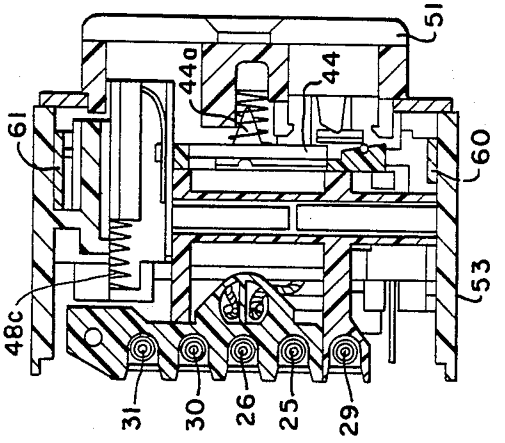
FIG. 11 is a sectional view taken along the line XI—XI of FIG. 10.
Figure 10:
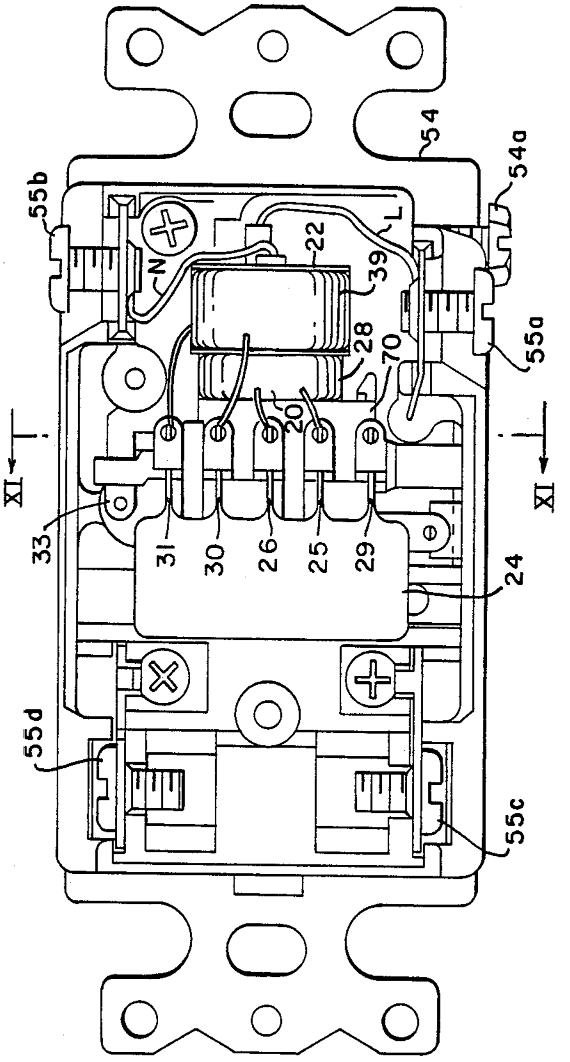
FIG. 10 is a rear view of an assembled ground fault receptacle but without its back cover.

When assembled, but without front and back covers in place, the unit 10 appears from the front as shown in FIG. 5 and from the back as shown in FIG. 10 with FIG. 6 being a sectional view of FIG. 5 and FIG. 11 being a sectional view of FIG. 10. Note that the views of FIGS. 6 and 11 omit the mounting yoke 54. In these views a physical arrangement of the elements of the circuit schematic of FIG. 1 can be seen.

Supply terminals 15 and 16 are represented by a pair of wiring or screw terminals 55*a* and 55*b* as shown in FIG. 10. The screw terminals 55*a* and 55*b* are each associated with a one piece load contact element 60 and 61 each of which runs down the side of the unit (FIG. 11) to another pair of wiring screw terminals 55*c* and 55*d* for wiring that proceeds through the distribution system to another receptacle or a switch.

Load or output terminals 17 and 18 of FIG. 1 are represented by the configuration as shown in FIG. 5 in which the unstanding female contact elements or fingers 60*a* and 61*a* of load contacts 60 and 61 are illustrated. The fingers 60*a* and 61*a* are internal contacts of the receptacle.

Sensing transformer 20 and grounded neutral transformer 22 are shown in FIG. 10 with conductors L and N from the screw terminals 55*a* and 55*b* entering within the central apertures of these cores as line and neutral primary conductors. Windings 28 and 39 are on the exterior of transformers 20 and 22, respectively.

The electronic circuit 24 is shown in FIG. 10 in the form of a hybrid having five leads 25, 26, 29, 30 and 31 for connection with the rest of the unit.

The switch structure is essentially in accordance with the two above-mentioned U.S. Pat. Nos. 4,010,431 and 4,442,470. A commutator plate, part of the mechanical linkage 44 of the switch, is shown in FIGS. 6 and 11 along with other elements in accordance with the above patents.

Of particular interest in FIG. 5 is the disposition of a metal oxide varistor element 32 between the upstanding contact fingers 60*a* and 61*a*. The varistor 32 is a disk-shaped element that is inserted between spring fingers and held by them in electrical contact so as to satisfy the circuit as shown in FIG. 1. It is additionally the case that the top cover 51 of the unit has a protrusion that extends within the base cavity within which the varistor 32 is located and secures it against dislodgement.

Figure 5A:
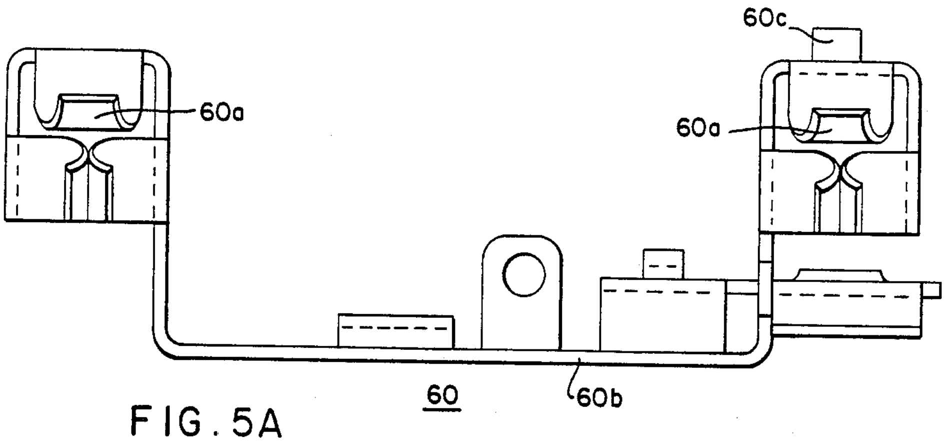
FIGS. 5A and 5B are respectively top and partial end views of a contact element in accordance with the present invention.

FIG. 5A shows one of the load terminal members 60 for the unit 10. A second load terminal member 61, one being for the "hot" line conductor L and the other being for the neutral conductor N, is substantially like the first except that it is a mirror image thereof.

Figure 5B:
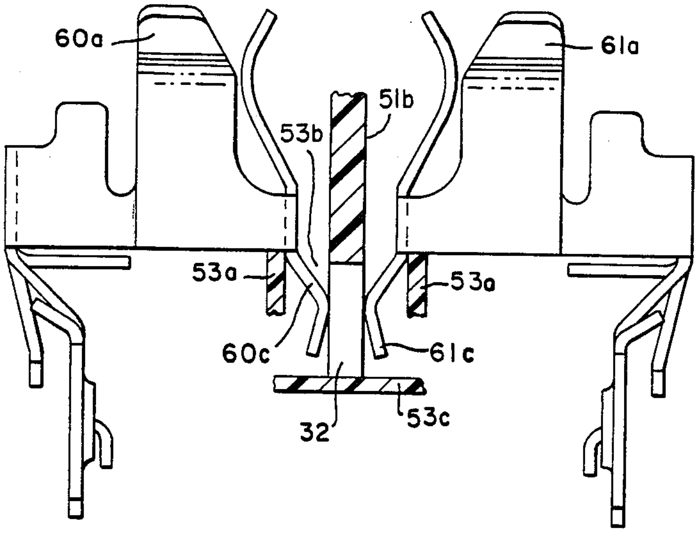

In most respects the load terminal members 60 and 61 have features in accordance with prior practice and are each of a unitary member of conductive material. Upstanding female contact elements 60*a* at each end are physically and electrically joined by a side piece 60*b* that runs within a slot in the base 53 adjacent the base outside wall. What is specifically varied from prior practice is that at one end of the terminal member 60 there is an additional element 60*c*, unitary with the rest of the member, that is a varistor spring contact element that extends down (away from the face of the unit) and somewhat laterally toward the other load terminal member. FIG. 5B shows a partial end view of terminal members 60 and 61 with the configuration of spring contacts or elements 60*c* and 61*c* shown having varistor 32 therebetween.

The varistor spring contact element 60*c* and 61*c* of each of the load terminal members 60 and 61 face each other in the assembled unit as shown in FIGS. 5 and 5B. In prior receptacles it was the practice to have one of the inner housing walls extend between adjoining compartments for line and neutral contacts which is favorable for electrical isolation. The change of the present invention, however, is to have a space between the terminal members accommodating the disk shaped varistor element 32. The varistor 32 is located on edge so the varistor spring contact elements 60*c* and 61*c* of each of the terminal members bear against the opposing major surfaces of the varistor 32 making pressure electrical contact therewith without the need for soldering or the like.

In FIG. 5B is seen that a base housing wall 53*a* permits contact spring element 60*c* to fit over it and bear against the varistor disk 32 that rests on the bottom of one of the housing recesses 53*b*. The other contact spring element 61*c* is likewise so disposed over another base housing wall 53*a*. An additional feature is that the front cover 51 has a projection 51*b* that extends between the terminals 60*c* and 61*c* and bears against the edge surface of the varistor disk 32 sufficiently to hold the varistor in place between 60*c* and 61*c* against the bottom 53*c* of the base recess 53*b*. In this way the cooperation between the housing base 53, front cover 51, terminal members 60 and 61 and varistor 32 achieves secure and electrically effective protection of unit. Other than through the varistor 32, the contacts 60 and 61 are electrically isolated by portions of the housing structure.

Figure 13:
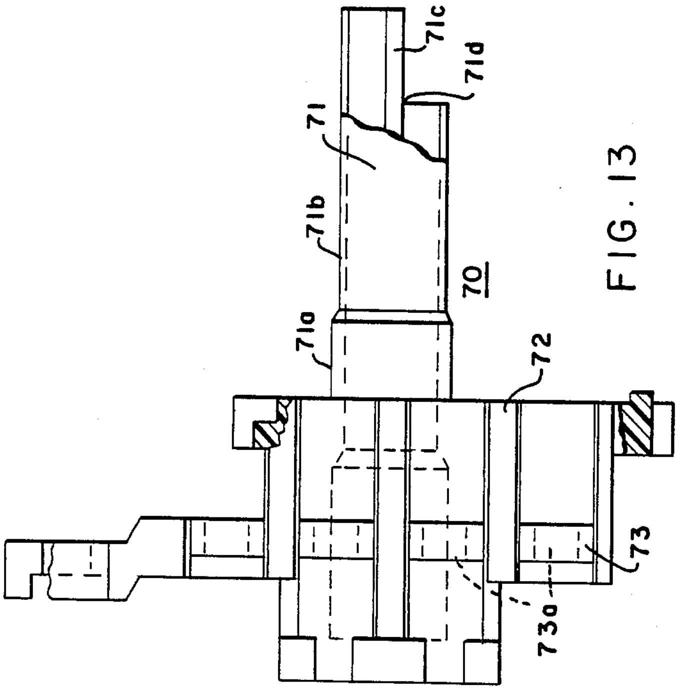
FIG. 12 and FIG. 13 are respectively side and top views of a carrier for use in accordance with the present invention.
Figure 12:
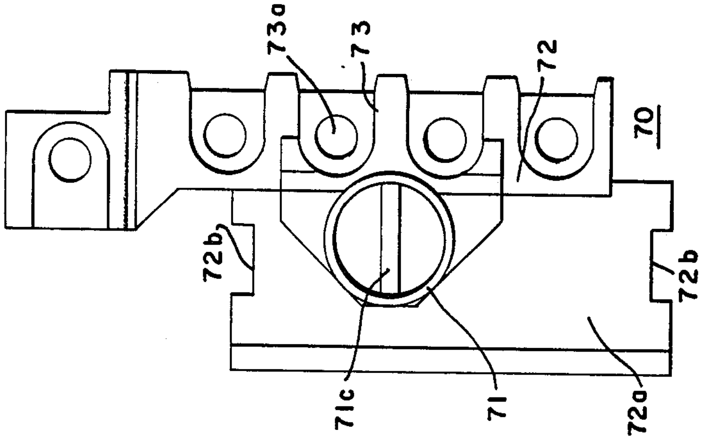

The other aspect of the unit that contributes considerably to low cost assembly while maintaining high reliability is a carrier pre-assembly. A carrier member 70 for transformers 20 and 22 and the circuit 24 is shown in FIGS. 12 and 13 and is formed of a unitary piece of molded plastic material. In reference to the assembled back view of FIG. 10, FIG. 12 is a view of the carrier 70 from the left and FIG. 13 is a view in the same orientation as FIG. 10.

The carrier 70 has the following elements and features:

A barrel portion 71 of generally cylindrical configuration that is sized, in this example, with areas 71*a* and 71*b* of slightly different diameter that respectively just accommodate the sensor and grounded neutral transformer cores 20 and 22. The center of the barrel portion 71 is hollow with a central longitudinal partition 71*c* forming two channels for respective bare conductors L and N. The barrel extremity has an offset portion 71*d* so leads L and N are electrically isolated from each other as shown in FIG. 10.

A bulkhead portion 72 of carrier 70 encompasses a cross-sectional portion of the barrel 71 and has a larger substantially rectangular portion 72*a* with notches 72*b* for joining to it a solenoid bobbin or subcarrier, to be described.

A circuit mounting portion 73 of carrier 70 extends above the barrel (in the view of FIG. 13) and has apertures or eyelets 73*a* in which leads from the electronic circuit 24 are inserted.

Figure 14:
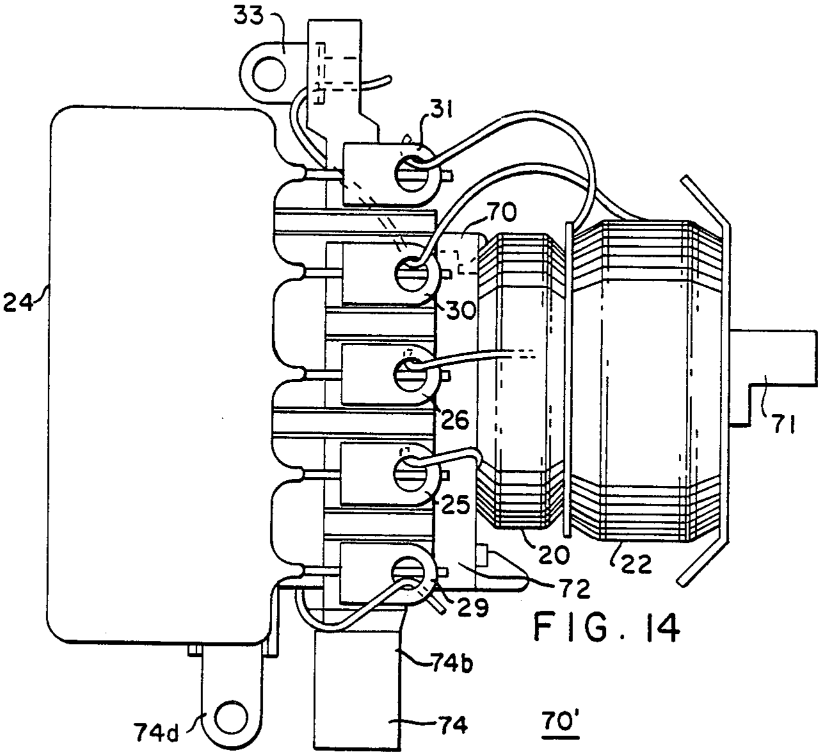
FIGS. 14 and 15 are respectively side and top elevation views of an assembled carrier unit in accordance with the present invention.
Figure 15:
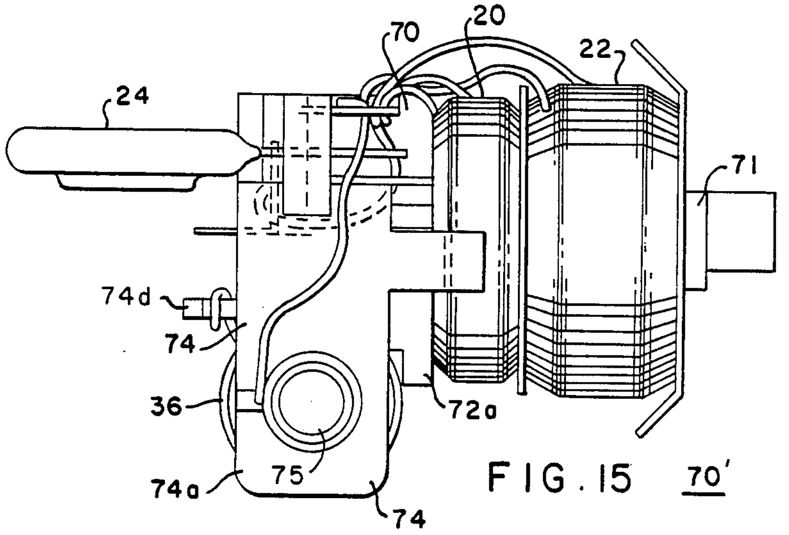
Figure 16:
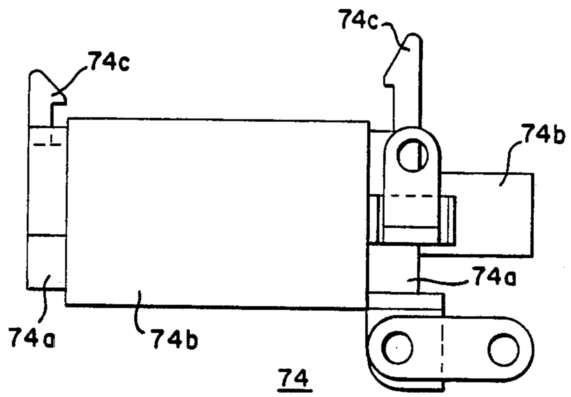
FIG. 16 is a side view of an unassembled solenoid bobbin subcarrier.

FIGS. 14 and 15 show the assembled carrier 70' with transformers 20 and 22 and circuit 24 as well as solenoid bobbin or subcarrier 74. The solenoid bobbin 74 is of a separate molded plastic piece. It has a pair of end walls 74*a* (both of which are seen in FIG. 16) between which and beyond one of which is a solenoid barrel portion 74*b*. The solenoid coil 36 is wound on the barrel 74*b* and the solenoid trip actuator or plunger of the mechanical linkage 44 extends through the barrel. The end walls 74*a* of the bobbin 74 have clip portions 74*c* that fit into the wall 72*a* of the carrier 70 at the notches 72*b*. The bobbin 74 has a portion 74*d* with an eyelet for a conductor.

FIG. 16 shows the solenoid subcarrier 74 separately.

The carrier assembly makes the assembly of the unit 10 much easier because now the transformer cores 20 and 22, solenoid parts 36 and 36*a* 36, the solenoid plunger of mechanical linkage 44, and circuit 24 may all be pre-assembled independent of the housing 50. After the assembly 70' has been put in place as a unit, the assembler is only required to make the necessary electrical connections for the line and neutral conductors while it is in the housing.

In assembly the following sequence of operations is suitable. The housing base 53 is arranged for assembly from the front with the base being as shown in FIG. 3 (shown after assembly in FIG. 5). The test resistor 47 is inserted upright in base opening 47*a*. The upper lead 47*c* of resistor 47 is laid in a groove 47*d* in the base 53.

The contact assembly 60, on the side near the test resistor 47 (the "line" side), is then inserted, the commutator elements 44 are then put in place. Leads L and N of the commutator extend through openings in the base as shown in FIG. 6. The other ("neutral" side) contact assembly 61 is placed. After these operations a test spring 48*b* in the format of a leaf spring (FIG. 5) is placed over the top lead of 47*c* of resistor 47 and both are wedged between contact 60 and the base molding for electrical continuity. The metal oxide varistor disk 32 is slipped between the spring fingers 60*c* and 61*c* of the contacts 60 and 61.

The reset spring 48*c* is put in place, extending through the base to the back side. The yoke 54 is located and then the reset button pre-assembly is arranged. This concludes the placement of components in the base 53 from the front side. The front cover 51, with its pre-assembly cover spring, is then put on the base 53 and fasteners applied. The front cover 51 with its projection 51*b* to hold the metal oxide varistor 32 is placed over the base front assembly wherein the front cover spring goes over the projection 44a on the commutator of mechanical linkage 44.

After the front assembly, with the front cover in place, is completed, the unit is reversed with the base 53 in the position shown in FIG. 8. The carrier 70' with everything mounted on it is fed with leads L and N from the commutator of mechanical linkage 44 into respective channels of the barrel portion 71. A plunger 75 is inserted in the solenoid bobbin barrel 74b and placed onto the carrier 70'. Then the assembled carrier 70' is placed in the base by threading eyelet 33 over the lead of reset spring 48c. The eyelet on the solenoid bobbin 74 is located over a tab on the load contact on the line side. Then the few required soldering and welding operations are performed to complete the circuitry. The bottom cover 52 and its two screws 56 are placed in proper location and the unit fastened together.

It is therefore seen that the present invention provides increased facility and economy in the assembly of ground fault receptacles. The examples shown and described are illustrative of the practice of the invention although numerous variations can be made consistent with the general teachings herein.

I claim:

1. A ground fault receptacle comprising:

an insulative housing including a base and a cover, said cover having plug blade receiving apertures therein, said housing containing internal contacts for engaging with the blades of a plug inserted in said cover apertures and also containing components of a ground fault interrupter;

said ground fault interrupter comprising a sensor transformer core and a grounded neutral transformer core each of which has a pair of conductors extending through a central aperture therein, said pair of conductors being connected with wiring terminals accessible on the exterior of said housing, said ground fault interrupter also comprising a sense amplifier and trip circuit connected with a sensing winding on said sensor transformer core and a varistor conductively engaged between two of said internal contacts, said varistor being in the form of a disk with opposing major surfaces respectively engaging individual ones of spring fingers of said internal contacts, said varistor disk also having an edge surface extending between said major surfaces, said cover having an inner surface with a protrusion extending therefrom bearing against said varistor disk edge surface and maintains said varistor disk securely in place in said housing between said spring fingers.

2. A ground fault receptacle in accordance with claim 1 wherein:

said varistor major surfaces make conductive engagement with said spring fingers by pressure contact without bonding.

3. A ground fault receptacle in accordance with claim 1 wherein:

said ground fault interrupter further comprises a switch for controlling conduction through said conductors, a solenoid plunger and a solenoid trip coil related with said sense amplifier and trip circuit to respond to a sensed ground fault to operate said switch, and a component carrier separable from and fitting within said housing and having interrelated insulative mounting means holding said cores, said circuit, said solenoid plunger and said solenoid trip coil in a unit.

4. A ground fault receptacle in accordance with claim 1 wherein:

said base includes walls that together with said protrusion of said cover electrically isolate said internal contacts from each other except through said varistor disk.

5. A ground fault receptacle component subassembly comprising:

a molded plastic carrier member with sensor and grounded neutral transformer cores on a generally cylindrical barrel portion with selectively sized portions accommodating and retaining said sensor and grounded neutral transformer cores, said barrel portion having a hollow center for line and neutral conductors to extend therethrough;

a bulkhead portion of said carrier member encompassing a cross-sectional portion of said barrel portion and having a portion for joining a solenoid bobbin subcarrier thereto;

a circuit mounting portion of said carrier member extending on the side of said barrel portion away from said bulkhead portion for joining a solenoid bobbin subcarrier and having apertures aligned and receiving parallel leads of an electronic circuit supported thereby.

6. A ground fault receptacle component subassembly in accordance with claim 5 wherein:

said hollow center of said barrel portion has a central longitudinal partition forming two channels for conductors extending therethrough with electrical isolation therebetween.

7. A ground fault receptacle component subassembly in accordance with claim 5 wherein:

a solenoid bobbin subcarrier is joined with said carrier and comprises a molded plastic piece separate from said carrier member and having a solenoid barrel portion between a pair of end walls that have clip portions that fit on and are retained by notches on said bulkhead portion of said carrier member.

8. A ground fault receptacle comprising:

an insulative housing including a base and a cover, said cover having plug blade receiving apertures therein, said housing containing internal contacts for engaging with the blades of a plug inserted in said cover apertures and also containing components of a ground fault interrupter;

said ground fault interrupter comprising a sensor transformer core and a grounded neutral transformer core each of which has a pair of conductors extending through a central aperture therein, said pair of conductors being connected with wiring terminals accessible on the exterior of said housing, said ground fault interrupter also comprising a sense amplifier and trip circuit connected with a sensing winding on said sensor transformer core and a varistor conductively engaged between two of said internal contacts;

said insulative mounting means of said component carrier comprising (a) a generally cylindrical barrel portion on which said cores are accommodated and retained, said barrel portion having a hollow center through which said pair of conductors extend;

(b) a bulkhead portion encompassing a cross-sectional portion of said barrel portion;

(c) a solenoid bobbin subcarrier jointed to a portion of said bulkhead portion; and (d) a circuit mounting portion extending on the side of said barrel portion away from said bulkhead portion and having apertures aligned with and receiving leads of an electric circuit supported thereby.

9. A ground fault receptacle in accordance with claim 8 wherein:

said hollow center of said barrel portion through which said pair of conductors extend has a central longitudinal partition electrically isolating said pair of conductors from each other; and a solenoid bobbin subcarrier is joined with said carrier and comprises a molded plastic piece separate from said carrier member and having a solenoid barrel portion between a pair of end walls that have clip portions that fit on and are retained by notches on said bulkhead portion of said carrier member.

* * * * *